(12) United States Patent
Jambunathan et al.

(10) Patent No.: US 10,403,752 B2
(45) Date of Patent: Sep. 3, 2019

(54) PREVENTION OF SUBCHANNEL LEAKAGE CURRENT IN A SEMICONDUCTOR DEVICE WITH A FIN STRUCTURE

(71) Applicant: Intel Corporation, Santa Clara, CA (US)

(72) Inventors: Karthik Jambunathan, Hillsboro, OR (US); Glenn A. Glass, Portland, OR (US); Chandra S. Mohapatra, Hillsboro, OR (US); Anand S. Murthy, Portland, OR (US); Stephen M. Cea, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/525,183

(22) PCT Filed: Dec. 22, 2014

(86) PCT No.: PCT/US2014/071841
§ 371 (c)(1),
(2) Date: May 8, 2017

(87) PCT Pub. No.: WO2016/105336
PCT Pub. Date: Jun. 30, 2016

(65) Prior Publication Data
US 2017/0330966 A1    Nov. 16, 2017

(51) Int. Cl.
*H01L 29/78*    (2006.01)
*H01L 29/06*    (2006.01)
(Continued)

(52) U.S. Cl.
CPC ...... *H01L 29/7831* (2013.01); *H01L 29/0607* (2013.01); *H01L 29/1054* (2013.01);
(Continued)

(58) Field of Classification Search
CPC ............. H01L 29/7831; H01L 29/0607; H01L 29/1054; H01L 29/66795; H01L 29/66803; H01L 29/785
(Continued)

(56) References Cited

U.S. PATENT DOCUMENTS

| 8,497,171 B1 | 7/2013 | Wu et al. |
| 2002/0011612 A1 | 1/2002 | Hieda |

(Continued)

FOREIGN PATENT DOCUMENTS

| EP | 2947695 A1 | 11/2015 |
| TW | 201409581 A | 3/2014 |
| TW | 201434156 A | 9/2014 |

OTHER PUBLICATIONS

U.S. Appl. No. 15/125,437, filed Sep. 12, 2016, entitled "Techniques for Forming Ge/Sige-Channel and Iii-V-Channel Transistors on the Same Die" by Glen A. Glass, et al.

(Continued)

*Primary Examiner* — Didarul A Mazumder
(74) *Attorney, Agent, or Firm* — Trop, Pruner & Hu, P.C.

(57) ABSTRACT

An embodiment includes an apparatus comprising: a fin structure on a substrate, the fin structure including fin top and bottom portions, a channel including a majority carrier, and an epitaxial (EPI) layer; an insulation layer including insulation layer top and bottom portions adjacent the fin top and bottom portions; wherein (a) the EPI layer comprises one or more of group IV and lll-V materials, (b) the fin bottom portion includes a fin bottom portion concentration of dopants of opposite polarity to the majority carrier, (c) the fin top portion includes a fin top portion concentration of the dopants less than the fin bottom portion concentration, (d) the insulation layer bottom portion includes an insulation layer bottom portion concentration of the dopants, and (e) the insulation layer top portion includes an insulation top (Continued)

layer portion concentration greater than the insulation bottom portion concentration. Other embodiments are described herein.

18 Claims, 3 Drawing Sheets

(51) Int. Cl.
*H01L 29/10* (2006.01)
*H01L 29/66* (2006.01)
(52) U.S. Cl.
CPC .. *H01L 29/66795* (2013.01); *H01L 29/66803* (2013.01); *H01L 29/785* (2013.01)
(58) Field of Classification Search
USPC ......................................................... 257/241
See application file for complete search history.

(56) References Cited

U.S. PATENT DOCUMENTS

| | | | |
|---|---|---|---|
| 2006/0076625 A1* | 4/2006 | Lee | H01L 29/7851 257/353 |
| 2011/0042748 A1 | 2/2011 | Anderson et al. | |
| 2011/0049613 A1* | 3/2011 | Yeh | H01L 29/66795 257/327 |
| 2013/0154028 A1 | 6/2013 | Wang et al. | |
| 2014/0061820 A1 | 3/2014 | Reznicek et al. | |
| 2014/0065782 A1 | 3/2014 | Lu et al. | |
| 2014/0239347 A1 | 8/2014 | Van Dal | |
| 2014/0264485 A1 | 9/2014 | Li et al. | |
| 2014/0264594 A1 | 9/2014 | Adam et al. | |
| 2014/0353801 A1 | 12/2014 | Jacob et al. | |
| 2015/0069474 A1* | 3/2015 | Ching | H01L 29/7842 257/288 |
| 2015/0340502 A1 | 11/2015 | Ponoth et al. | |

OTHER PUBLICATIONS

International Searching Authority, "Notification of Transmittal of the International Search Report and the Written Opinion of the International Searching Authority," dated Sep. 17, 2015, in International application No. PCT/US2014/071841.

Taiwan Intellectual Property Office, Office Action dated Jan. 28, 2019 in Taiwan Patent Application 104138311, three pages.

European Patent Office, Extended European Search Report dated Nov. 15, 2018 in European Patent Application No. 14909194.4, nine pages.

* cited by examiner

PREVENTION OF SUBCHANNEL LEAKAGE CURRENT IN A SEMICONDUCTOR DEVICE WITH A FIN STRUCTURE

TECHNICAL FIELD

Embodiments of the invention are in the field of semiconductor devices and, in particular, non-planar transistors.

BACKGROUND

A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
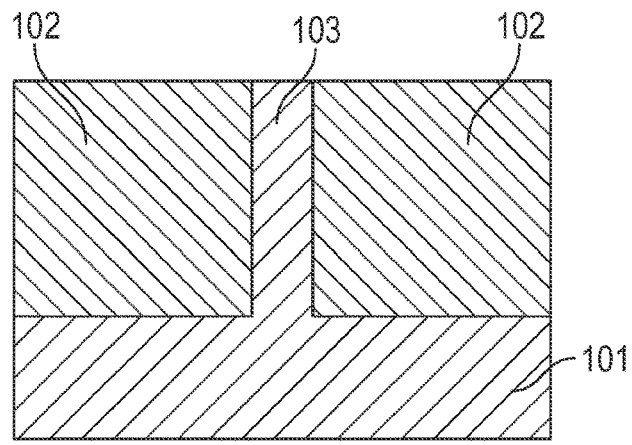
FIGS. 1-2 depict front cross-sectional views of various embodiments of the invention at various processing stages.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Power consumption is a major consideration in circuit development. When transistors are in their off state, the current draw through unintentional leakage paths of the transistors should preferably be minimized. A major leakage path in planar and FinFET transistors is in the sub-channel region (sometimes referred to as a "sub-fin" region in FinFets or in general, "sub-structure"). To limit this path, designers of conventional transistors attempt to employ sharp positive/negative (p/n) junctions between the source and channel/sub-channel region and between the drain and channel/sub-channel region. In conventional planar transistor designs this sharp p/n junction is commonly accomplished using judicious well counter doping of the sub channel or sub-structure regions. For example, for a p-MOS device the well below the channel is negatively (n) doped and for an n-MOS device the well below the channel is p doped.

However, applicants have identified this technique is problematic in both narrow planar transistors (e.g., transistor having a well diffusion width <30 nm) and FinFETs. Specifically, a problem is that the maximum achievable dopant concentration (achieved using implant techniques to perform doping) following back end of line (BEOL) processing (operations performed on the semiconductor wafer in the course of device manufacturing following first metallization) is insufficient to arrest this leakage (e.g., $1E17$ cm$^\wedge$–3 in group IV transistors and $1E16$ cm$^\wedge$–3 in III-V transistors).

An embodiment addresses this problem by enabling arbitrarily high doping concentrations in sub-channel regions. Specifically, an embodiment achieves well doping by removing fins (e.g., Si fins) or narrow diffusion channel elements and replacing the same using epitaxial (EPI) growth in a recess (e.g., trench). The epitaxial material formed in the trench is arbitrarily doped such that, even after dopant loss occurs due to segregation to interfaces during subsequent thermal steps and evaporation (i.e., BEOL processing), the sub-channel area maintains a high dopant concentration. Generally, doping requirements are higher in the sub-channel region than in the channel region and epitaxial processing is compatible with the arbitrary dopant profiles described immediately above. Furthermore, embodiments using this trench-based concept may include channel regions and/or sub-channel regions that are strained, relaxed, or strain neutral.

Thus, with conventional techniques the ultimate achievable end-of-line EOL subchannel doping concentration is limited to less-than-desirable levels. However, using embodiments that have EPI replacement sub-channel and channel regions achieve sufficiently high doping levels in the channel and/or sub-channel regions.

In FIG. 1, in an embodiment fin 103 is patterned on substrate 101 using conventional FinFET techniques. Substrate 101 may include, for example, Si, $Si_{1-x}Ge_x$, Ge, silicon-on-insulator (SOI), SiGe-on-insulator, Si-on-nothing (SON) (whereby a buried oxide from SOI is replaced with an insulator having a lower dielectric constant such that an air gap is present under the silicon layer), and SiGe-onnothing using standard photolithography techniques followed by wet/dry etching. The entire structure is then covered with a layer of insulating material 102 (i.e., using Shallow Trench Isolation (STI)) containing, for example, Si oxide or Si nitride such that the fins are fully submerged in STI 102. The top surface of STI 102 is then polished down to the top of fin 103 to form a smooth surface parallel to the substrate 101, as seen in FIG. 1.

Figure 2:
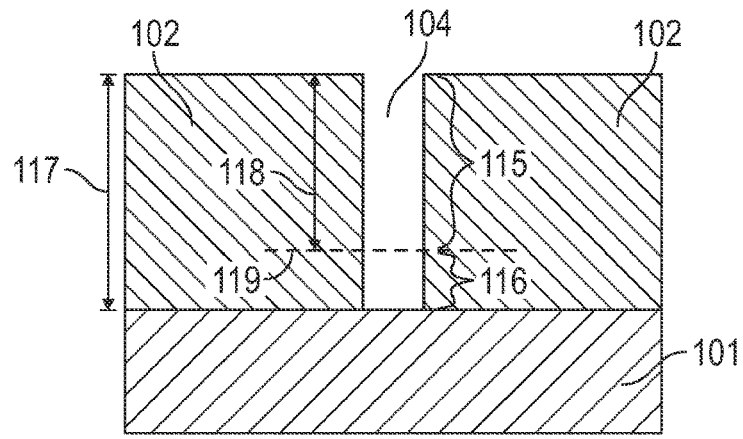

In FIG. 2 fin 103 is removed/etched using wet/dry etching techniques to form trench 104 in STI 102 with substrate 101 at the bottom of trench 104. In other embodiments fin 103 can be partially etched out (see distance between line 119 and top of trench 104) to form a trench 104 with a height 118 smaller than the STI 102 thickness 117.

Figure 3A:
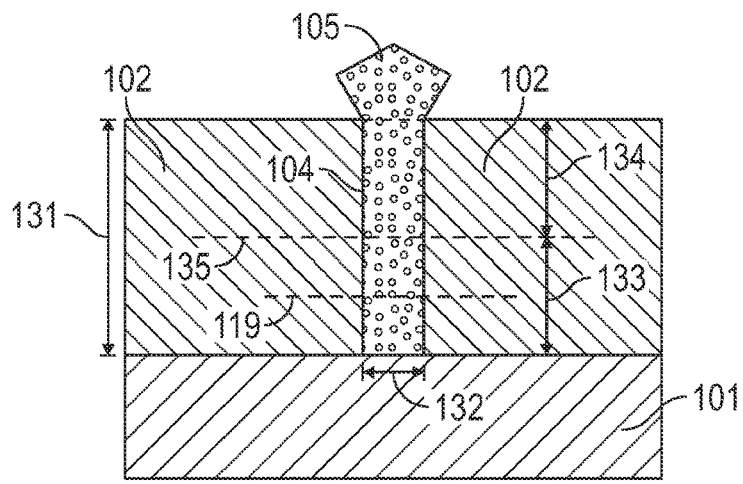
FIGS. 3a and 4a depict front cross-sectional views of a uniformly doped fin structure in an embodiment of the invention at different processing stages.
Figure 3B:
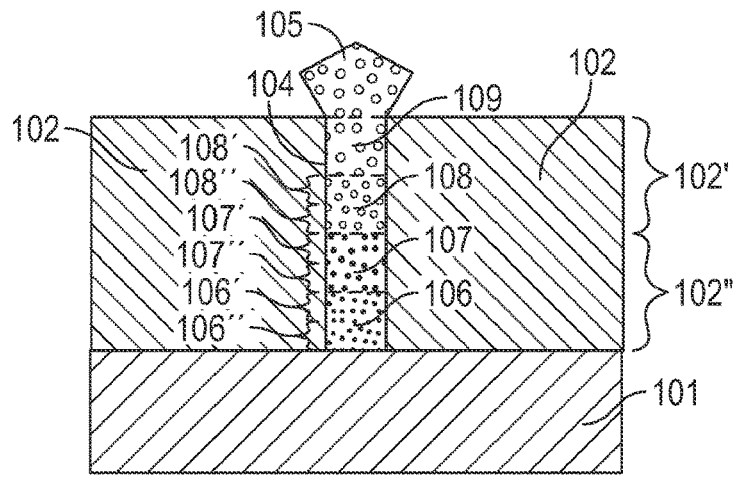
FIGS. 3b and 4b depict front cross-sectional views of a uniformly doped fin structure in an embodiment of the invention at different processing stages.

In FIGS. 3A-B trench 104 is filled with a "fill material" 105, such as $Si_xGe_{1-x}$ (0<x<1), $Ge_xSn_{1-x}$ (0<x<1), $In_xGa_{1-x}As$ (0<x<1), or other III-V materials grown selectively via chemical vapor deposition (CVD) or molecular beam epitaxy (MBE) so that trench 104 is completely filled with filler material 105. The material 105 grown in the trenches may be doped positively or negatively with, for example, P, As, Sb, B, Al, Ga, C, Si, Ge, Sn, Zn, Te, Mg such that the doping is opposite to the transistor majority carrier type (e.g., where electrons are majority carrier in n-type semiconductors and holes are majority carrier in p-type semiconductors). The dopant concentration of fill material 105 within trench 104 may be uniform (FIG. 3A) or graded (FIG. 3B) with a higher concentration at the bottom of the trench than at the top of the trench.

Regarding FIG. 3A in particular, the uniform doping throughout fill material 105 may occur via in situ doping.

Regarding FIG. 3B in particular, the embodiment includes three different areas of doping concentration with area 106 being more heavily doped than area 107, area 107 being more heavily doped than area 108, and area 108 being more heavily doped than area 109. In an embodiment the fill material 105 is formed in stages. For example, area 106 is formed and then ion implantation occurs. This may create a sub-area 106' that is more heavily doped than sub-area 106". Then area 107 is formed with subsequent ion implantation at a level less than that of area 106' and/or area 106". Then area 108 is formed with subsequent ion implantation at a level less than that of area 107' and/or area 107". Then area 109 is formed with subsequent ion implantation at a level less than that of area 108' and/or area 108".

As mentioned above, in situ and implant doping are both used in different embodiments. In situ doping may result in the relative absence of dopant atoms in isolation material 102 and simultaneously the presence of dopant channels in the fill material 105. Implant doping may result in the presence of dopant atoms in the isolation material 102 and the fill material. In such a case the doping may be strongest in area 102' and lightest in area 102". Thus, while at least one of areas 106', 106" is more strongly doped than is area 109 the opposite is true with STI 102 in that the upper area 102' (which is adjacent area 109) is more heavily doped than the lower area 102" (which is adjacent area 106).

Figure 4A:
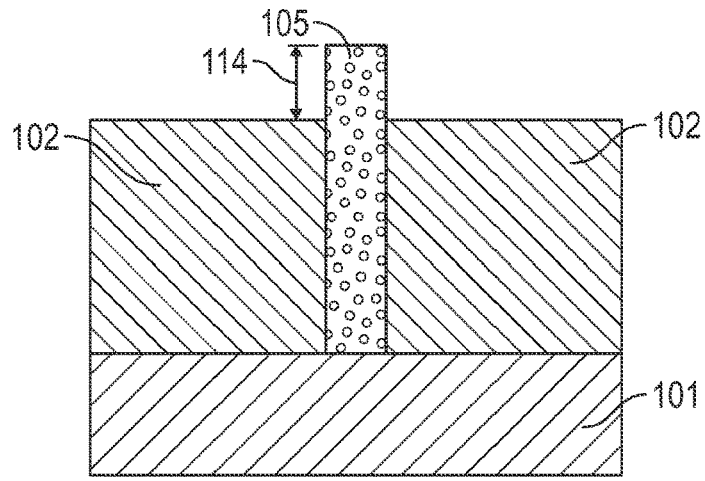
Figure 4B:
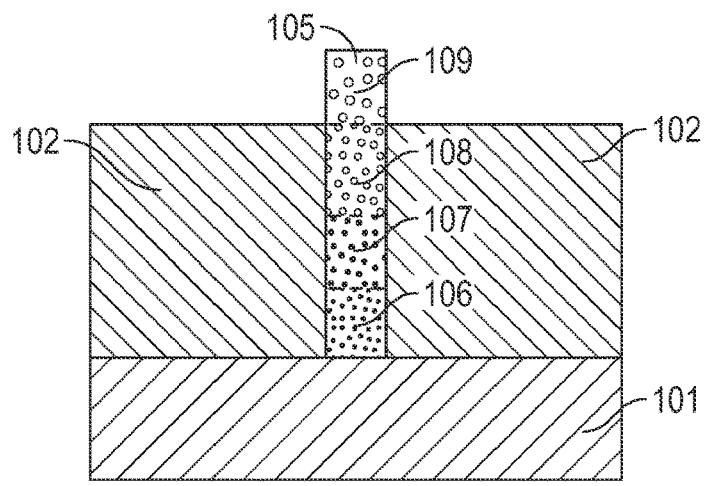

Afterwards the material 105 within the trench 104 is then polished to obtain a smooth surface parallel to the underlying substrate. In FIGS. 4A-B the STI 102 is then recessed with wet/dry etching to form fins of the channel material 105. However, when using an implant doping technique (as opposed to in situ doping), the order of polishing and implantation is reversed (i.e., when doping via implantation, the polishing of FIGS. 4A-B can be performed before the implantation steps of FIGS. 3A-B).

Figure 4C:
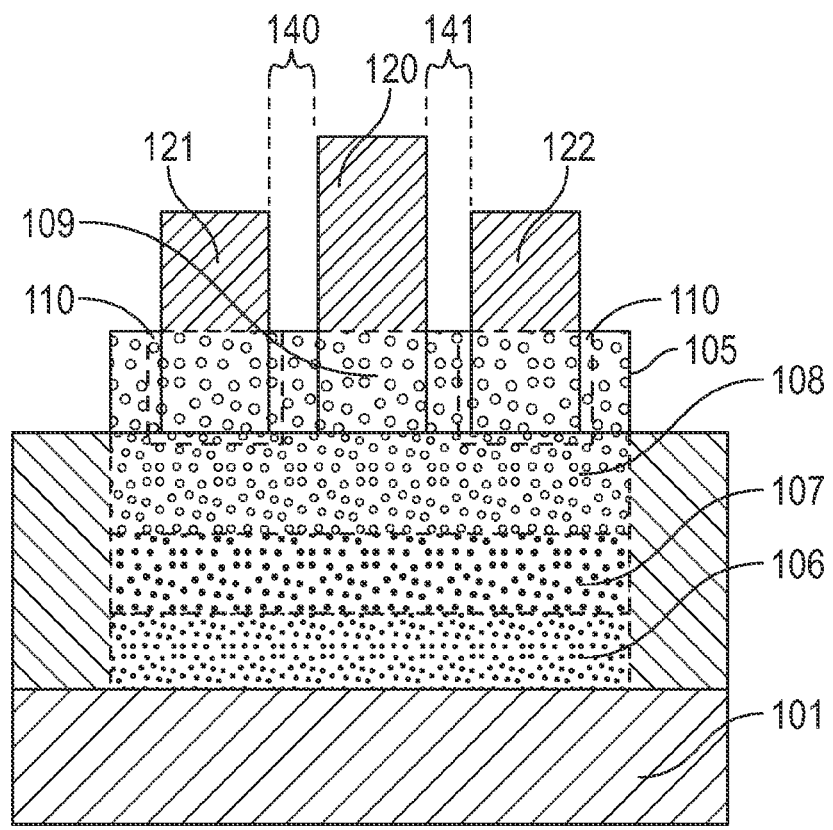
FIG. 4c depicts a side cross-sectional view of the embodiment of FIG. 4b.

FIG. 4C shows a side view of the embodiment of FIG. 4B but also includes gate electrode 120, source electrode 121, and drain electrode 122. Further, areas 110 are doped counter to that areas 106, 107, and/or 108 (i.e., area 110 is doped positively if area 106 is doped negatively and vice versa). Doping of areas 110 may be performed while a mask is over areas such as area 109. In other words, during the doping of the subfin volume (e.g., area 106 below the channel) and during the deposition of the source/drain areas 110 for PMOS (NMOS) locations, NMOS (PMOS) locations are covered by a masking layer.

Of course, variations with processing exist in different embodiments. The process flow can be "gate first" or "gate last" with doping of the source/drain regions 110 occurring after or before doping beneath the channel occurs. In an embodiment during the fabrication of the well-doped subfin layer for PMOS (NMOS) devices, the entire trench fill material for PMOS (NMOS) is exposed to doping including the areas under the source, drain, and the gate (with masking and opposite doping of areas 110 to occur subsequently). In an embodiment the source 121 and drain 122 can be either wrapped around the fin 105 or can be deposited on a partially/fully etched out fin at the source/drain location (i.e., partially or fully recessed and regrown source/drain or raised source drain).

Various embodiments include a semiconductive substrate. Such a substrate may be a bulk semiconductive material this is part of a wafer. In an embodiment, the semiconductive substrate is a bulk semiconductive material as part of a chip that has been singulated from a wafer.

The following examples pertain to further embodiments.

Example 1 includes an apparatus comprising: a fin structure on a substrate, the fin structure including a fin top portion, a fin bottom portion, a channel including a majority carrier, and an epitaxial (EPI) layer; and an insulation layer including an insulation layer top portion, adjacent the fin top portion, and an insulation layer bottom portion, adjacent the fin bottom portion; wherein (a) the EPI layer comprises at least one of a group IV material and a group III-V material, (b) the fin bottom portion includes a fin bottom portion concentration of dopants of opposite polarity to the majority carrier, (c) the fin top portion includes a fin top portion concentration of the dopants less than the fin bottom portion concentration, (d) the insulation layer bottom portion includes an insulation layer bottom portion concentration of the dopants, and (e) the insulation layer top portion includes an insulation top layer portion concentration greater than the insulation bottom portion concentration.

The majority carrier may be electrons or holes to create NMOS or PMOS or CMOS switching devices. The insulation layer may include STI.

In example 2 the subject matter of the Example 1 can optionally include a well within the fin bottom portion.

In example 3 the subject matter of the Examples 1-2 can optionally include wherein the EPI layer comprises the group III-V material.

In example 4 the subject matter of the Examples 1-3 can optionally include wherein the EPI layer is included in the channel and couples to a source and a drain of a transistor.

In example 5 the subject matter of the Examples 1-4 can optionally include the substrate which includes Si.

In example 6 the subject matter of the Examples 1-5 can optionally include wherein the fin structure is not monolithic with the substrate.

For example, in FIG. 4b fin portion 106 is not monolithic with substrate 101. However, as described above in some embodiments such as FIG. 2, a fin portion above line 119 may coexist with a fin portion reaching up from substrate 101 towards line 119. In such a case fin portion 115 would be non-monolithic with fin portion 116 where portion 115 had been etched out within trench 104 only to be filled in again subsequently.

In example 7 the subject matter of the Examples 1-6 can optionally include wherein the channel is strained.

In example 8 the subject matter of the Examples 1-7 can optionally include wherein the insulation layer extends below a bottom-most edge of the fin structure. For example, in FIG. 2 STI 102 extends below line 119 and consequently below fin portion 115.

In example 9 the subject matter of the Examples 1-8 can optionally include wherein the fin structure extends above a top-most edge of the insulation layer.

For example, in FIG. 4a fin 105 extends above STI 102 by a distance 114.

In example 10 the subject matter of the Examples 1-9 can optionally include wherein the fin structure includes a fin middle portion, between the fin top and bottom portions, including a fin middle portion concentration of dopants less than the fin bottom portion concentration and greater than the fin top portion concentration.

For example, in FIG. 4b portion 107 is more lightly doped than portion 106 but more heavily doped than portion 108.

In example 11 the subject matter of the Examples 1-10 can optionally include wherein: the fin bottom portion includes a first subportion and a second subportion below the first subportion; the first subportion includes a first subportion concentration of the dopants; and the second subportion includes a second subportion concentration of the dopants less than the first subportion concentration.

For example, in FIG. 3b subportion 106' is more heavily doped than portion 106".

In example 12 the subject matter of the Examples 1-11 can optionally include wherein: the EPI layer is included in both of the fin top and bottom portions; the EPI layer included in the fin top portion has fewer dislocations than the EPI layer included in the bottom fin portion; and the fin structure is included in a trench having an aspect ratio (height:width) of at least 2:1.

For example, in FIG. 3a the aspect ratio for trench 104 may be at least 2:1 because distance 131 is more than two times distance 132. Due to ART this my keep all or the majority of dislocations in EPI material 105 within the lower half 133 of trench 104 instead of the upper half 134 of trench 104.

In example 13 the subject matter of the Examples 1-12 can optionally include wherein the fin bottom portion includes a first material having a first energy bandgap and the fin top portion includes a second material having a second energy bandgap lower than the first energy bandgap.

For example, in FIG. 3b portion 106 may have material with a higher bandgap than the material for portion 107 and/or portion 108. In an embodiment instead of changing the dopant concentration between two layers (e.g., layers 106, 107) of trench 104 instead the materials may have the same or similar dopant concentration but have a higher bandgap material below a lower bandgap material. In some embodiments lower layers (e.g., layer 106) may have both more doping and higher bandgap than upper portions or layers (e.g., layer 107).

In example 14 the subject matter of the Examples 1-13 can optionally include an additional fin structure on the substrate, the additional fin structure including an additional fin top portion, an additional fin bottom portion, an additional channel including an additional majority carrier opposite the majority carrier, and an additional EPI layer; and an additional insulation layer including an additional insulation layer top portion, adjacent the additional fin top portion, and an additional insulation layer bottom portion, adjacent the additional fin bottom portion; wherein (a) the additional EPI layer comprises at least one of a group IV material and a group III-V material, (b) the additional fin bottom portion includes an additional fin bottom portion concentration of additional dopants of opposite polarity to the additional majority carrier, (c) the additional fin top portion includes an additional fin top portion concentration of the additional dopants less than the additional fin bottom portion concentration, (d) the additional insulation layer bottom portion includes an additional insulation layer bottom portion concentration of the additional dopants, and (e) the additional insulation layer top portion includes an additional insulation top layer portion concentration greater than the additional insulation bottom portion concentration.

For example, in an embodiment two fins, such as fin 103 of FIG. 1, may be adjacent each other. However, the fins may be processed separately at different times. For example, one of the fins may be removed (wholly or partially) as shown in FIG. 2 and then built to create a NMOS device (while masking the other fin during some or all of the process used to create the NMOS device). Then the other fin may be processed to create a PMOS device while making the NMOS device during some or all of the processing of the PMOS device. Doing so may yield CMOS systems.

In example 15 the subject matter of the Examples 1-14 can optionally include wherein the fin top portion is included in an upper half of the fin structure, the fin bottom portion is included in a lower half of the fin structure, the insulation layer top portion is included in a top half of the insulation layer, and the insulation bottom portion is included in a bottom half of the insulation layer.

For example the top and bottom halves of STI 102 and trench 104 may be defined by line 135 of FIG. 3a.

Example 16 includes an apparatus comprising: a fin structure on a substrate, the fin structure including a fin top portion, a fin bottom portion, a channel including a majority carrier, and an epitaxial (EPI) layer; and an insulation layer including an insulation layer top portion, adjacent to and directly contacting the fin top portion, and an insulation layer bottom portion, adjacent to and directly contacting the fin bottom portion; wherein (a) the EPI layer comprises at least one of a group IV material and a group III-V material, (b) the fin bottom portion includes a fin bottom portion concentration of dopants of opposite polarity to the majority carrier, (c) the fin top portion includes a fin top portion concentration of the dopants less than the fin bottom portion concentration, and (d) the insulation layer top and bottom portions each include generally less than 1E17/cm^3 of the dopants.

For example, an embodiment may involve in situ doping of fin 105 wherein there is little doping gradient in fin 105 and little doping in surrounding STI 102. FIG. 3a depicts a structure having this doping arrangement.

In example 17 the subject matter of the Example 16 can optionally include a well within the fin bottom portion and wherein the insulation layer top and bottom portions are each within 20 nm of the fin structure.

Thus, the insulation layer top and bottom portions may each include generally less than 1E17/cm^3 of the dopants and those portions are not anywhere on the chip but relatively close to the trench 104. Such portions may be included in areas between source 121 and gate 120, such as area 140.

Such portions may be included in areas between drain 122 and gate 120, such as area 141.

In example 18 the subject matter of the Examples 16-17 can optionally include wherein the fin structure extends above a top-most edge of the insulation layer.

Example 19 includes an apparatus comprising: a fin structure on a substrate, the fin structure including a fin top portion, a fin bottom portion, a channel including a majority carrier, and an epitaxial (EPI) layer; and an insulation layer including an insulation layer top portion, adjacent the fin top portion, and an insulation layer bottom portion, adjacent the fin bottom portion; wherein (a) the EPI layer comprises at least one of a group IV material and a group III-V material, (b) the fin bottom portion includes a fin bottom portion concentration of dopants of opposite polarity to the majority carrier, (c) the fin top portion includes a fin top portion concentration of the dopants generally equal to the fin bottom portion concentration, and (d) the insulation layer top and bottom portions each include generally less than $1E17/cm^3$ of the dopants.

In example 20 the subject matter of the Example 19 can optionally include a well within the fin bottom portion.

In example 21 the subject matter of the Examples 19-20 can optionally include wherein the fin structure extends above a top-most edge of the insulation layer.

An embodiment includes a method comprising: (a) forming a fin structure on a substrate; (b) forming an insulation layer around the fin, (c) removing some or all of the fin to form a trench within the insulation layer, (d) filling some or all of the trench with one or more EPI layers, and (e) removing a portion of the STI to expose an upper portion of the EPI layer. An embodiment may form source, drain, and gate contacts on the fin. An embodiment may dope the subchannel/sub-fin area in graduated fashion and/or equal fashion using implant and/or in situ doping.

An embodiment includes a method comprising: (a) forming a fin structure on a substrate; (b) forming an insulation layer around the fin, (c) removing some or all of the fin to form a trench within the insulation layer, (d) filling some of the trench with a first EPI layer, (e) doping the first EPI layer, (f) filling some more of the trench with a second EPI layer, (g) doping the second EPI layer more lightly than the first EPI layer in a manner counter to the majority carrier for the fin, and (h) doping upper portions of the insulation layer more heavily than lower portions of the insulation layer. An embodiment may form source, drain, and gate contacts on the fin. An embodiment may dope the subchannel/sub-fin area in graduated fashion and/or equal fashion using implant and/or in situ doping.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
a fin structure on a substrate, the fin structure including a fin top portion, a fin bottom portion, a channel including a majority carrier, and an epitaxial (EPI) layer; and
an insulation layer including an insulation layer top portion, adjacent the fin top portion, and an insulation layer bottom portion, adjacent the fin bottom portion;
wherein the EPI layer comprises at least one of a group IV material, a group III-V material, or combinations thereof, the fin bottom portion includes a fin bottom portion concentration of dopants of opposite polarity to the majority carrier, the fin top portion includes a fin top portion concentration of the dopants less than the fin bottom portion concentration, the insulation layer bottom portion includes an insulation layer bottom portion concentration of the dopants, and the insulation layer top portion includes an insulation top layer portion concentration greater than the insulation bottom portion concentration.

2. The apparatus of claim 1 including a well within the fin bottom portion.

3. The apparatus of claim 1 wherein the EPI layer comprises the group III-V material.

4. The apparatus of claim 3 wherein the EPI layer is included in the channel and couples to a source and a drain of a transistor.

5. The apparatus of claim 3 comprising the substrate, wherein the substrate includes Si.

6. The apparatus of claim 1 wherein the fin structure is not monolithic with the substrate.

7. The apparatus of claim 6 wherein the channel is strained.

8. The apparatus of claim 7 wherein the insulation layer extends below a bottommost edge of the fin structure.

9. The apparatus of claim 1 wherein the fin structure extends above a top-most edge of the insulation layer.

10. The apparatus of claim 1 wherein the fin structure includes a fin middle portion, between the fin top and bottom portions, including a fin middle portion concentration of dopants that is less than the fin bottom portion concentration and greater than the fin top portion concentration.

11. The apparatus of claim 1, wherein:
the fin bottom portion includes a first subportion and a second subportion below the first subportion;
the first subportion includes a first subportion concentration of the dopants; and
the second subportion includes a second subportion concentration of the dopants less than the first subportion concentration.

12. The apparatus of claim 1, wherein:
the EPI layer is included in both of the fin top and bottom portions;
the EPI layer included in the fin top portion has fewer dislocations than the EPI layer included in the bottom fin portion; and the fin structure is included in a trench having an aspect ratio (height:width) of at least 2:1.

13. The apparatus of claim 1, wherein the fin bottom portion includes a first material having a first energy bandgap and the fin top portion includes a second material having a second energy bandgap that is lower than the first energy bandgap.

14. The apparatus of claim 1 comprising:
an additional fin structure on the substrate, the additional fin structure including an additional fin top portion, an additional fin bottom portion, an additional channel including an additional majority carrier opposite the majority carrier, and an additional EPI layer; and
an additional insulation layer including an additional insulation layer top portion, adjacent the additional fin top portion, and an additional insulation layer bottom portion, adjacent the additional fin bottom portion;
wherein (a) the additional EPI layer comprises at least one of a group IV material, a group III-V material, or a combination thereof, (b) the additional fin bottom portion includes an additional fin bottom portion concentration of additional dopants of opposite polarity to the additional majority carrier, (c) the additional fin top portion includes an additional fin top portion concentration of the additional dopants less than the additional fin bottom portion concentration, (d) the additional insulation layer bottom portion includes an additional insulation layer bottom portion concentration of the additional dopants, and (e) the additional insulation layer top portion includes an additional insulation top layer portion concentration greater than the additional insulation bottom portion concentration.

15. The apparatus of claim 1, wherein the fin top portion is included in an upper half of the fin structure, the fin bottom portion is included in a lower half of the fin structure, the insulation layer top portion is included in a top half of the insulation layer, and the insulation bottom portion is included in a bottom half of the insulation layer.

16. An apparatus comprising:
a fin structure on a substrate, the fin structure including a fin top portion, a fin bottom portion, a channel including a majority carrier, and an epitaxial (EPI) layer; and
an insulation layer including an insulation layer top portion that is adjacent to and directly contacting the fin top portion, and an insulation layer bottom portion that is adjacent to and directly contacting the fin bottom portion;
wherein: the EPI layer comprises at least one of a group IV material, a group III-V material, or a combination thereof, the fin bottom portion includes a fin bottom portion concentration of dopants of opposite polarity to the majority carrier, the fin top portion includes a fin top portion concentration of the dopants less than the fin bottom portion concentration.

17. The apparatus of claim 16 including a well within the fin bottom portion and wherein the insulation layer top and bottom portions are each within 20 nm of the fin structure.

18. The apparatus of claim 16 wherein the fin structure extends above a top-most edge of the insulation layer.

* * * * *